US010672702B2

(12) United States Patent
Kim et al.

(10) Patent No.: US 10,672,702 B2
(45) Date of Patent: Jun. 2, 2020

(54) INTEGRATED CIRCUIT INCLUDING STANDARD CELL

(71) Applicant: SAMSUNG ELECTRONICS CO., LTD., Suwon-si (KR)

(72) Inventors: In-gyum Kim, Bucheon-si (KR); Ha-young Kim, Seoul (KR); Tae-joong Song, Seongnam-si (KR); Jong-hoon Jung, Seongnam-si (KR); Gi-young Yang, Seoul (KR); Jin-young Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/433,092

(22) Filed: Jun. 6, 2019

(65) Prior Publication Data

US 2019/0287891 A1    Sep. 19, 2019

Related U.S. Application Data

(62) Division of application No. 15/871,206, filed on Jan. 15, 2018, now Pat. No. 10,354,947.

(30) Foreign Application Priority Data

Feb. 6, 2017   (KR) .................. 10-2017-0015987
Oct. 27, 2017  (KR) .................. 10-2017-0141320

(51) Int. Cl.
| | | |
|---|---|---|
| *H01L 23/50* | (2006.01) | |
| *H01L 29/788* | (2006.01) | |
| *H01L 23/528* | (2006.01) | |
| *H01L 27/02* | (2006.01) | |

(Continued)

(52) U.S. Cl.
CPC ............ *H01L 23/50* (2013.01); *H01L 23/528* (2013.01); *H01L 23/5286* (2013.01); *H01L 27/0207* (2013.01); *H01L 27/11807* (2013.01); *H01L 29/788* (2013.01); *H01L 23/49838* (2013.01);

(Continued)

(58) Field of Classification Search
CPC ... H01L 23/50; H01L 23/528; H01L 23/5286; H01L 27/0207; H01L 27/11807; H01L 29/788
See application file for complete search history.

(56) References Cited

U.S. PATENT DOCUMENTS

| | | |
|---|---|---|
| 7,808,017 B2 | 10/2010 | Hamada |
| 8,759,885 B1 | 6/2014 | Jain et al. |
| 9,190,405 B2 | 11/2015 | Chen et al. |

(Continued)

*Primary Examiner* — Allan R Wilson
(74) *Attorney, Agent, or Firm* — Sughrue Mion, PLLC

(57) ABSTRACT

A standard cell of an IC includes a cell area including a transistor configured to determine a function of the standard cell; a first dummy area and a second dummy area respectively adjacent to two sides of the cell area in a first direction; and an active area extending in the first direction across the cell area, the first dummy area, and the second dummy area. The active area includes a first active area and a second active area spaced apart from each other in a second direction perpendicular to the first direction and extend parallel to each other in the first direction. At least one of the first active area and the second active area provided in the first dummy area is biased, and at least one of the first active area and the second active area provided in the second dummy area is biased.

14 Claims, 11 Drawing Sheets

(51) Int. Cl.
*H01L 27/118* (2006.01)
*H01L 23/498* (2006.01)

(52) U.S. Cl.
CPC . *H01L 2027/11831* (2013.01); *H01L 2924/14* (2013.01)

(56) References Cited

U.S. PATENT DOCUMENTS

| | | |
|---|---|---|
| 9,245,887 B2 | 1/2016 | Chiang et al. |
| 9,397,083 B2 | 7/2016 | Shimizu |
| 10,199,378 B2* | 2/2019 | Jain .................. H01L 21/82341 |
| 2005/0044522 A1 | 2/2005 | Maeda |
| 2014/0097493 A1 | 4/2014 | Baek et al. |
| 2014/0183647 A1 | 7/2014 | Lu et al. |
| 2015/0155274 A1 | 6/2015 | Jeong et al. |
| 2015/0356225 A1 | 12/2015 | Lu et al. |
| 2016/0117431 A1 | 4/2016 | Kim et al. |
| 2016/0306911 A1 | 10/2016 | Kuo et al. |
| 2016/0335389 A1 | 11/2016 | Yuan et al. |
| 2018/0075182 A1 | 3/2018 | Zhuang et al. |
| 2018/0151567 A1 | 5/2018 | Lin et al. |
| 2019/0164950 A1* | 5/2019 | Shimbo ............... H01L 27/0207 |
| 2019/0164993 A1* | 5/2019 | Shimbo ............... H01L 27/0207 |

\* cited by examiner

| DUMMY STRUCTURE | PFET Active Region | | NFET Active Region | | gate |
|---|---|---|---|---|---|
| | Dummy | Cell | Dummy | Cell | |
| DA1 | VDD | VDD | VSS | VSS | VDD/VSS/Floating gate |
| DA2 | Floating/Signal/VDD | Signal | VSS | VSS | VDD |
| DA3 | VDD | VDD | Floating/Signal/VSS | Signal | VSS |

| DUMMY STRUCTURE | PFET Active Region | | NFET Active Region | | gate |
|---|---|---|---|---|---|
| | Dummy | Cell | Dummy | Cell | |
| DA1_b | VDD | VDD | VSS | VSS | VDD/VSS/Floating gate |
| DA2_b | VDD | Signal | VSS | VSS | VDD |
| DA3_c | VDD | VDD | VSS | Signal | VSS |

# INTEGRATED CIRCUIT INCLUDING STANDARD CELL

CROSS-REFERENCE TO RELATED APPLICATIONS

This is a divisional of U.S. application Ser. No. 15/871,206 filed Jan. 15, 2018, which claims priority from Korean Patent Application Nos. 10-2017-0015987, filed on Feb. 6, 2017 and 10-2017-0141320, filed on Oct. 27, 2017, in the Korean Intellectual Property Office. The disclosures of the above-named applications are incorporated herein in their entireties by reference.

BACKGROUND

Apparatuses and methods consistent with example embodiments relate to an integrated circuit (IC), and more particularly, to an IC including a standard cell including a dummy area.

An IC may be designed based on standard cells. Specifically, standard cells may be arranged based on data defining the IC and routed to generate a layout of the IC. With the miniaturization of semiconductors, a size of patterns in a standard cell and a size of the standard cell may be reduced during a manufacturing process. Thus, the influence of a peripheral structure (i.e., a peripheral layout) of the standard cell upon the standard cell may increase. The influence of the peripheral layout may be referred to as a local layout effect (LLE) or a layout dependent effect (LDE).

SUMMARY

One or more example embodiments provide an integrated circuit (IC) including standard cells including a dummy area. More specifically, there is provided an IC in which a standard cell including a dummy area is located in consideration of a local layout effect (LLE).

According to an aspect of an example embodiment, there is provided an IC including a plurality of standard cells. At least one standard cell of the plurality of standard cells may include a power rail configured to supply power to the at least one standard cell, the power rail extending in a first direction; a cell area including at least one transistor configured to determine a function of the at least one standard cell; a first dummy area and a second dummy area respectively adjacent to two sides of the cell area in the first direction; and an active area extending in the first direction across the cell area, the first dummy area, and the second dummy area. A region of the active area, which is included in at least one of the first dummy area and the second dummy area, may be electrically connected to the power rail.

According to an aspect of an example embodiment, there is provided an IC including a plurality of standard cells. At least one standard cell of the plurality of standard cells may include a cell area including at least one transistor configured to determine a function of the at least one standard cell; a first dummy area and a second dummy area respectively adjacent to two sides of the cell area in a first direction; and an active area extending in the first direction across the cell area, the first dummy area, and the second dummy area. The active area may include a first active area and a second active area, which are spaced apart from each other in a second direction perpendicular to the first direction and extend parallel to each other in the first direction. At least one of the first active area and the second active area provided in the first dummy area is biased. At least one of the first active area and the second active area provided in the second dummy area may be biased.

According to an aspect of an example embodiment, there is provided an IC including a plurality of standard cells. At least one standard cell of the plurality of standard cells may include a first power rail and a second power rail, each power rail extending in a first direction to supply power to the at least one standard cell, the first power rail and the second power rail spaced apart from each other in a second direction perpendicular to the first direction; a cell area including at least one transistor configured to determine a function of the at least one standard cell; and an active area extending in the first direction across the cell area. The active area may include a first active area and a second active area, which are spaced apart from each other in the second direction and extend parallel to each other in the first direction. The first active area provided in the dummy area may be electrically connected to the first power rail, and the second active area provided in the dummy area may be electrically connected to the second power rail.

BRIEF DESCRIPTION OF THE DRAWINGS

The above and/or other aspects will be more clearly understood from the following detailed description taken in conjunction with the accompanying drawings in which.

DETAILED DESCRIPTION OF THE EMBODIMENTS

Figure 1A:
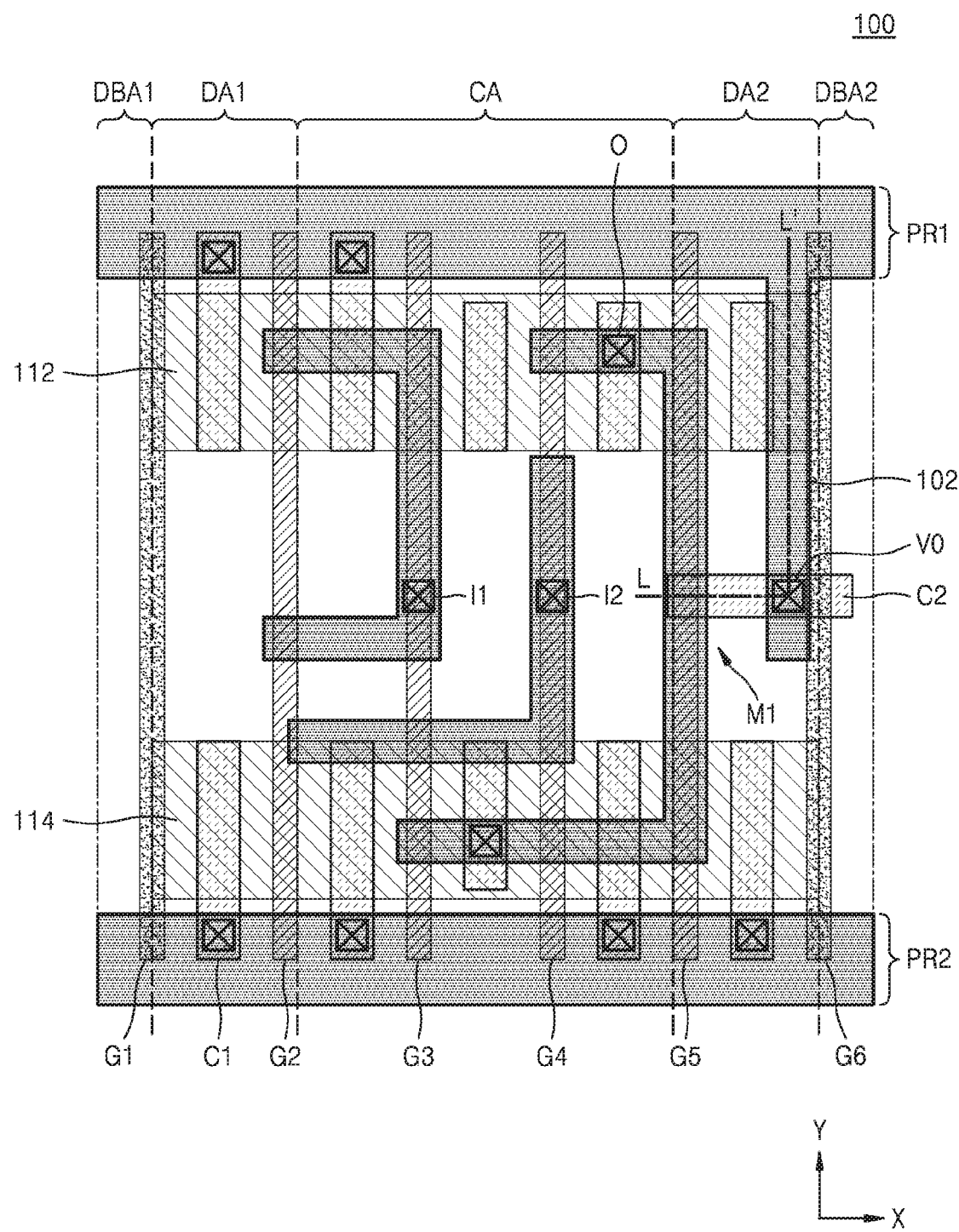
FIG. 1A illustrates a layout of a standard cell included in an integrated circuit (IC) according to an example embodiment.

Reference will now be made in detail to example embodiments, with reference to the accompanying drawings. In the drawings, parts irrelevant to the description are omitted to clearly describe the example embodiments, and like reference numerals refer to like elements throughout the specification. In this regard, the present example embodiments may have different forms and should not be construed as being limited to the descriptions set forth herein.

Throughout the specification, when it is described that a certain element is "connected" to another element, it should be understood that the certain element may be "directly connected" to another element or "electrically connected" to another element via another element in the middle. In addition, when a component "includes" an element, unless there is another opposite description thereto, it should be understood that the component does not exclude another element but may further include another element.

As used herein, the term "and/or" includes any and all combinations of one or more of the associated listed items. Expressions such as "at least one of," when preceding a list of elements, modify the entire list of elements and do not modify the individual elements of the list.

Hereinafter, the present disclosure is described in detail with reference to the accompanying drawings.

Figure 1B:
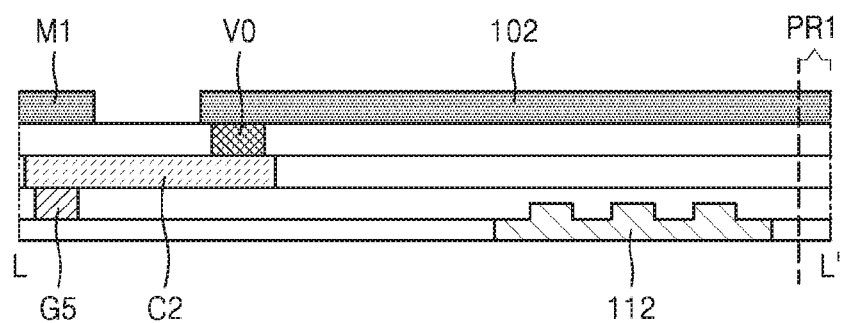
FIG. 1B is a cross-sectional view taken along a line L-L' of FIG. 1A.

FIG. 1A illustrates a layout of a standard cell 100 included in an integrated circuit (IC) according to an example embodiment, and FIG. 1B is a cross-sectional view taken along a line L-L' of FIG. 1A.

Referring to FIG. 1A, the standard cell 100 may include a cell area CA, a first boundary area DBA1 and a second boundary area DBA2 located at interface surfaces of the standard cell 100, and a first dummy area DA1 and a second dummy area DA2 respectively located adjacent to two sides of the cell area CA in a first direction X. The standard cell 100 may further include a first active area 112 and a second active area 114.

The cell area CA may include at least one transistor that may determine functions of the standard cell 100. For example, when a NOR logic gate or a NAND logic gate is formed in the cell area CA, the cell area CA may include two n-type transistors (e.g., n-type field-effect transistors (N-FETs)) and two p-type transistors (e.g., p-type field-effect transistors (P-FETs)). Characteristics of the standard cell 100 may depend on a number and kind of the transistors included in the cell area CA and a connection relationship between the transistors.

The first boundary area DBA1 and the second boundary area DBA2 may be provided at the interface surfaces of the standard cell 100 and serve as a basis for delineating the standard cell 100 from other adjacent standard cells. A double diffusion break may be formed in each of the first boundary area DBA1 and the second boundary area DBA2. The first active area 112 and the second active area 114 may be cut by the first boundary area DBA1 and the second boundary area DBA2. The first boundary area DBA1 and the second boundary area DBA2 will be described below later with reference to FIGS. 3A and 3B.

The first dummy area DA1 may be located between the first boundary area DBA1 and the cell area CA, and the second dummy area DA2 may be located between the second boundary area DBA2 and the cell area CA. Due to the arrangement of the first dummy area DA1 and the second dummy area DA2, a distance from each of the first boundary area DBA1 and the second boundary area DBA2 to the cell area CA may increase. Accordingly, an LLE on the cell area CA may be changed due to the first boundary area DBA1 and the second boundary area DBA2, and performance of the standard cell 100 may be improved. Also, an operation of generating interconnections between transistors included in the cell area CA may be facilitated due to a space ensured by the first dummy area DA1 and the second dummy area DA2 in the standard cell 100.

The first active area 112 and the second active area 114 may extend in the first direction X and be located parallel to each other in a second direction Y perpendicular to the first direction X. The first active area 112 may have a different conductivity from that of the second active area 114. For example, a p-type transistor may be formed in the first active area 112, and an n-type transistor may be formed in the second active area 114.

The standard cell 100 may further include a first power rail PR1 and a second power rail PR2, which may supply power to the standard cell 100 and extend in the first direction X. The first power rail PR1 may be a power supply voltage (VDD) rail, while the second power rail PR2 may be a ground voltage (VSS) rail. The first power rail PR1 may be electrically connected to a first metal line 102, which may extend in the second direction Y from the first power rail PR1.

The standard cell 100 may further include a plurality of gate lines G1 to G6, a plurality of metal lines metal lines M1, a first contact C1, and a second contact C2. The plurality of metal lines M1 may be located in a different layer from the first active area 112 and the second active area 114. Also, the plurality of metal lines M1 may be located in a different layer from the plurality of gate lines G1 to G6.

The first contact C1 may electrically connect the first active area 112 or the second active area 114 with the plurality of metal lines M1, and the second contact C2 may electrically connect the plurality of gate lines G1 to G6 with the plurality of metal lines M1. Each of the first contact C1 and the second contact C2 may be electrically connected to the plurality of metal lines M1 through a via V0.

Referring to FIGS. 1A and 1B, the standard cell 100 may further include a plurality of layers including a metal layer in which the first metal line 102 and the plurality of metal lines M1 are formed. The gate line G5 included in the second dummy area DA2 may be electrically connected to the first power rail PR1 through the first metal line 102. FIG. 1B illustrates a case in which the first power rail PR1 includes only a metal line included in the same layer as the first metal line 102, but the present disclosure is not limited thereto. The first power rail PR1 may include a plurality of metal lines included in different layers.

The gate line G5 may receive power from the first power rail PR1 through the first metal line 102, the second contact C2, and the via V0 without passing through the first active area 112.

The first active area 112 may include a plurality of pins. Although FIG. 1B illustrates a case in which the first active area 112 includes three pins, the present disclosure is not limited thereto.

Figure 2:
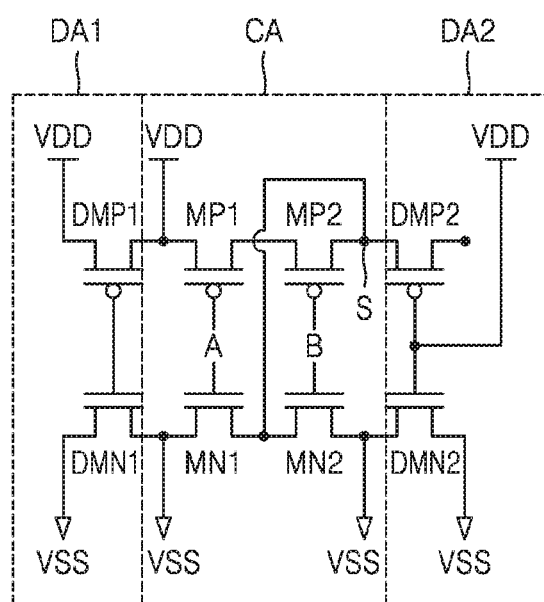
FIG. 2 is a circuit diagram of a standard cell included in an IC according to an example embodiment.

FIG. 2 is a circuit diagram of the standard cell 100 included in an IC according to an example embodiment. FIG. 2 is a circuit diagram corresponding to the standard cell 100 of FIG. 1A.

Referring to FIGS. 1A and 2, the standard cell 100 may further include a first input pin I1 to which a first input signal A is applied, a second input pin I2 to which a second input signal B is applied, and an output pin O from which an output signal S is output. The cell area CA may include a plurality of transistors, for example, transistors MP1, MP2, MN1, and MN2 having gates to which a first input signal A and a second input signal B are applied. The p-type transistors MP1 and MP2 may be connected to each other in series, and the transistors MP1, MP2, MN1, and MN2 included in the cell area CA may constitute a NOR logic gate. The transistors MP1, MP2, MN1, and MN2 may output the output signal S.

The first dummy area DA1 and the second dummy area DA2 may be located adjacent to the cell area CA, and a voltage applied to the first dummy area DA1 and the second dummy area DA2 may vary according to a voltage applied to the transistors MP1, MP2, MN1, and MN2 included in the cell area CA. A plurality of dummy transistors, for example, dummy transistors DMP1, DMP2, DMN1, and DMN2, may be formed in the first dummy area DA1 and the second dummy area DA2.

In an example embodiment, the gate line G2 included in the first dummy area DA1 may be electrically floated. The first active area 112 formed in the first dummy area DA1 may be electrically connected to the first power rail PR1 so that a voltage (e.g., a power supply voltage VDD) having a first level may be applied to the first active area 112 formed in the first dummy area DA1. The second active area 114 formed in the first dummy area DA1 may be electrically connected to the second power rail PR2 so that a voltage (e.g., a ground voltage VDD) having a second level lower than the first level may be applied to the second active area 114 formed in the first dummy area DA1. However, the present disclosure is not limited thereto, and a voltage having a first level VDD or a second level VSS may be applied to the gate line G2 included in the first dummy area DA1. A voltage applied to the first dummy area DA1 will be described below later with reference to FIGS. 5A and 5B.

In an example embodiment, the gate line G5 included in the second dummy area DA2 may be electrically connected to the first power rail PR1 so that a voltage having the first level VDD may be applied to the gate line G5. The first active area 112 formed in the second dummy area DA2 may be electrically floated, and the second active area 114 formed in the second dummy area DA2 may be electrically connected to the second power rail PR2 so that a voltage having a second level VSS may be applied to the second active area 114 formed in the second dummy area DA2.

Figure 3A:
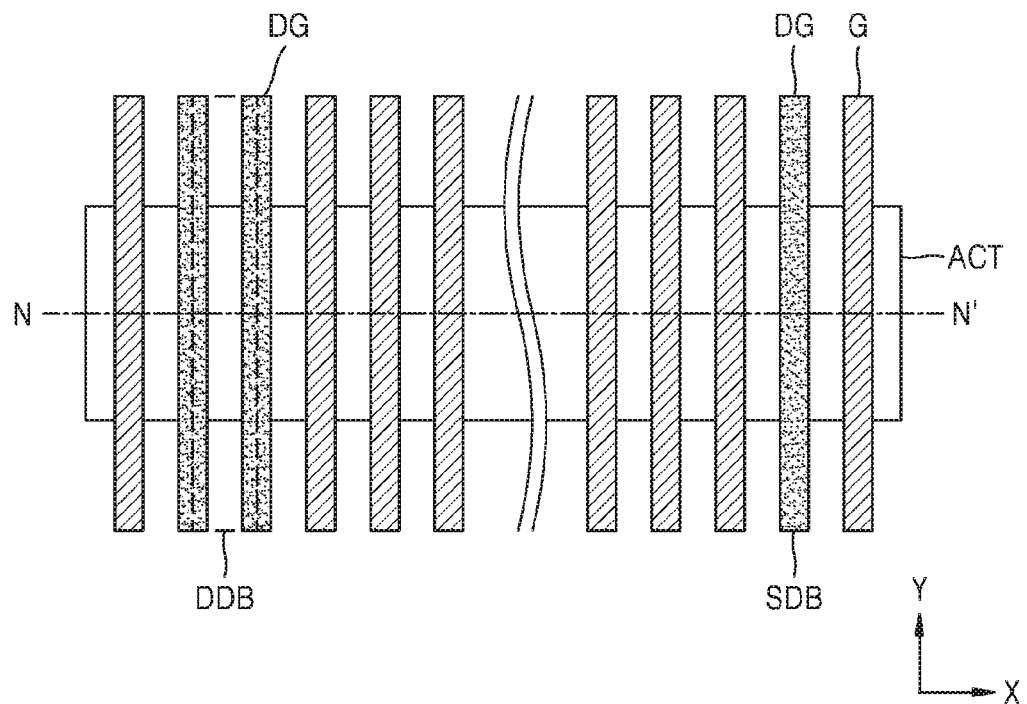
FIG. 3A illustrates a layout of an IC according to an example embodiment.
Figure 3B:
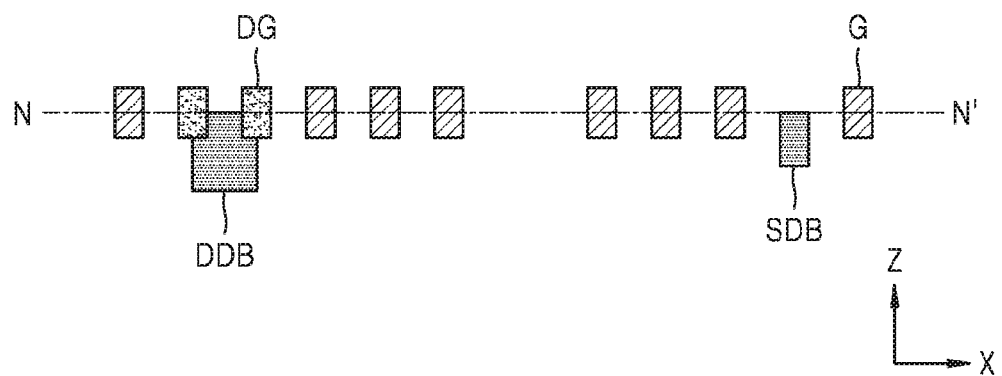
FIG. 3B is a cross-sectional view taken a line M-M' of FIG. 3A.

FIG. 3A illustrates a layout of an IC according to an example embodiment. FIG. 3B is a cross-sectional view taken along a line N-N' of FIG. 3A. FIGS. 3A and 3B are diagrams of the first and second boundary areas DBA1 and DBA2 shown in FIG. 1A.

Referring to FIGS. 3A and 3B, each of the first and second boundary areas DBA1 and DBA2 of FIG. 1A may be a double diffusion break DDB or a single diffusion break SDB. The gate line DG formed in the double diffusion break DDB or the single diffusion break SDB may be a dummy gate line. Standard cells may be electrically isolated from one another by using a diffusion break and a dummy gate line.

In an example embodiment, a cutting layer may be located between the standard cells to electrically isolate the standard cells from one another. That is, a layout of an IC including a plurality of standard cells may include the cutting layer between the standard cells. Here, the cutting layer may include an insulating material to cut active areas ACT between the standard cells. In the IC fabricated along the layout including the cutting layer, active areas ACT included in adjacent standard cells may be separated from one another, so that the adjacent standard cells may be electrically isolated from one another. The cutting layer may be a double diffusion break DDB or a single diffusion break SDB.

As shown in FIG. 3A, the double diffusion break DDB may refer to a cutting layer interposed between two adjacent dummy lines (e.g., dummy gates DG). In an example embodiment, a device isolation film including an insulating material may be formed in an IC fabricated along a layout including the double diffusion break DDB. For example, the device isolation film may include an oxide.

The single diffusion break SDB may refer to a cutting layer aligned to one dummy line (e.g., a dummy gate DG). In an embodiment, a device isolation film including an insulating material may be formed in an IC fabricated along a layout including the single diffusion break SDB. For example, the device isolation film may include a nitride.

As described above, the device isolation film formed by the double diffusion break DDB may include a different material from a material included in the device isolation film formed by the single diffusion break SDB. Thus, the influence of the double diffusion break DDB on a transistor included in the standard cell may be different from the influence of the single diffusion break SDB on a transistor included in the standard cell. For example, the double diffusion break DDB may degrade performance of a p-type transistor included in the standard cell, while the single diffusion break SDB may degrade performance of an n-type transistor included in the standard cell.

Referring back to FIG. 1A, in the standard cell 100, when a plurality of p-type transistors included in the cell area CA are connected in series and each of the first boundary area DBA1 and the second boundary area DBA2 is the double diffusion break DDB, the first dummy area DA1 and the second dummy area DA2 may be located between the cell area CA and the first boundary area DBA1 and between the cell area CA and the second boundary area DBA2, respectively. Thus, degradation of performance of the standard cell 100 due to the double diffusion break DDB may be prevented.

In another example embodiment, when a plurality of n-type transistors included in the cell area CA are connected in series and each of the first boundary area DBA1 and the second boundary area DBA2 is the single diffusion break SDB, a first dummy area and a second dummy area may be located so that degradation of performance of the standard cell due to the single diffusion break SDB may be prevented.

Figure 4:
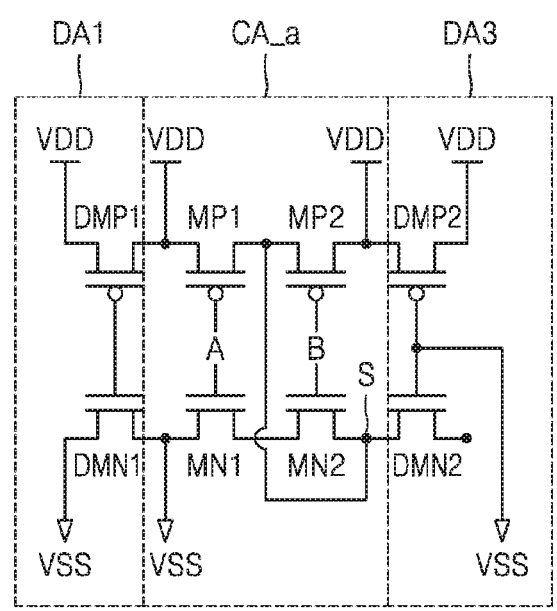
FIG. 4 is a circuit diagram of a standard cell included in an IC according to an example embodiment.

FIG. 4 is a circuit diagram of a standard cell 100 a included in an IC according to an example embodiment. In FIG. 4, the same reference numerals are used to denote the same elements as in FIG. 2. A detailed description of the same elements as in FIG. 2 will be omitted for brevity.

Referring to FIG. 4, the standard cell 100a may include a cell area CA_a, a first dummy area DA1, and a third dummy area DA3. The cell area CA_a may include a plurality of transistors, for example, transistors MP1, MP2, MN1, and MN2 having gates to which a first input signal A and a second input signal B are applied. The n-type transistors MN1 and MN2 may be connected to each other in series, and the transistors MP1, MP2, MN1, and MN2 included in the cell area CA_a may constitute a NAND logic gate. The transistors MP1, MP2, MN1, and MN2 may output an output signal S based on the first input signal A and the second input signal B.

In an example embodiment, a plurality of dummy transistors, for example, dummy transistors DMP2 and DMN2, may be formed in the third dummy area DA3. Gates of the dummy transistors DMP2 and DMN2 may be electrically connected to a second power rail PR2 so that a voltage having a second level VSS may be applied to the gates of the dummy transistors DMP2 and DMN2. The third dummy area DA3 may include a metal line that extends from the second power rail PR2 in a direction perpendicular to a direction in which the second power rail PR2 extends. The gates of the dummy transistors DMP2 and DMN2 may be electrically connected to the second power rail PR2 through the metal line.

A first active area (e.g., a region in which the dummy transistor DMP2 is formed) formed in the third dummy area DA3 may be electrically connected to the first power rail PR1 so that a voltage having a first level VDD may be applied to the first active area.

A second active area (e.g., a region in which the dummy transistor DMN2 is formed) formed in the third dummy area DA3 may be electrically floated. Since the voltage having the second VSS is applied to the gate of the dummy transistor DMN2, the second active area may be electrically floated. However, the present disclosure is not limited thereto, and a voltage applied to the third dummy area DA3 will be described below later with reference to FIGS. 5A and 5B.

Figures 5A, 5B:
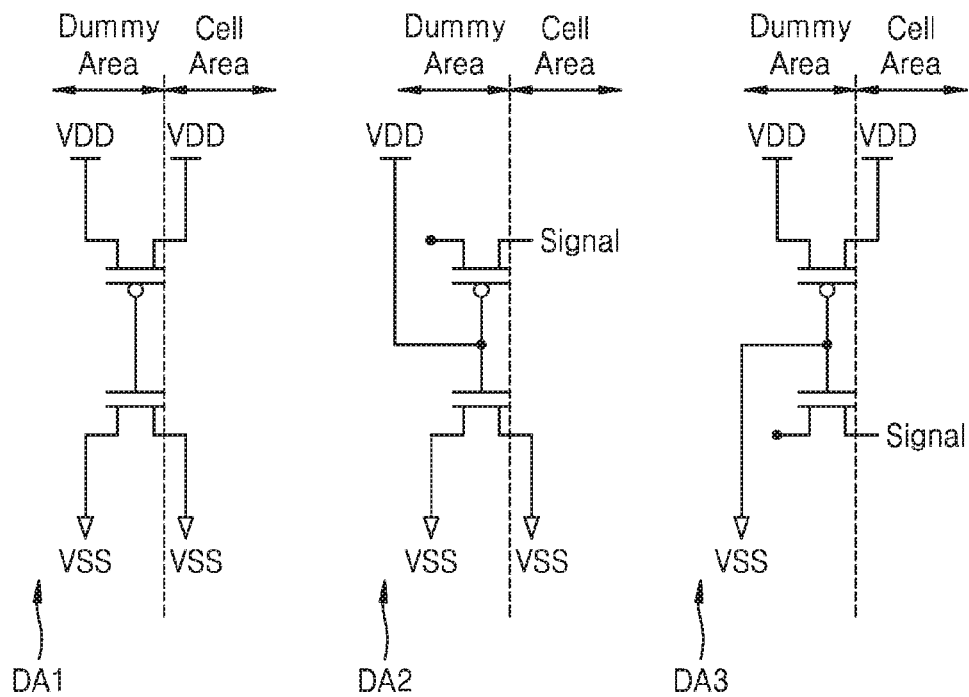
FIG. 5A is a circuit diagram of a dummy area of a standard cell included in an IC according to an example embodiment.
FIG. 5B is a table showing a voltage applied to a transistor formed in a dummy area.

FIG. 5A is a circuit diagram of a dummy area of a standard cell included in an IC according to an example embodiment. FIG. 5B is a table showing a voltage applied to a transistor formed in the dummy area.

Referring to FIGS. 5A and 5B, a standard cell included in an IC according to the example embodiment may include at least one of first to third dummy areas DA1, DA2, and DA3. For example, one of the first to third dummy areas DA1, DA2, and DA3 may be included in the standard cell in response to a voltage applied to an active area that is adjacent to the dummy area in a cell area. Gate lines included in the first to third dummy areas DA1, DA2, and DA3 may be electrically connected to a first power rail PR1 or a second power rail PR2 through a metal line (e.g., the first metal line 102 of FIG. 1A), which may extend from the first power rail PR1 or the second power rail PR2, so that a voltage may be applied to the gate lines.

The first dummy area DA1 may be located when, from among a region of the cell area adjacent to the dummy area, a voltage having a first level VDD is applied to an active area (e.g., the first active area 112 of FIG. 1A) in which a p-type transistor is formed and a voltage having a second level VSS is applied to an active area (e.g., the second active area 114 of FIG. 1A) in which an n-type transistor is formed. In this case, the voltage having the first level VDD may be applied to the active area of the first dummy area DA1 in which the p-type transistor is formed, while the voltage having the second level VSS may be applied to the active area of the first dummy area DA1 in which the n-type transistor is formed. The voltage having the first level VDD or the second level VSS may be applied to the gate line included in the first dummy area DA1. Alternatively, as shown in FIG. 5A, the gate line included in the first dummy area DA1 may be floated. Even if a voltage is not applied to the gate line included in the first dummy area DA1, since the same voltage is applied to a source region and a drain region of the transistor, an output signal of the cell area may not be affected.

The second dummy area DA2 may be located when, from among the region of the cell area adjacent to the dummy area, an output signal is output from the active region in which the p-type transistor is formed and a voltage having the second level VSS is applied to the active area in which the n-type transistor is formed. In this case, a voltage having the first level VDD may be applied to the gate line included in the second dummy area DA2. Thus, the output signal of the cell area may be prevented from being affected by the gate line included in the second dummy area DA2 and the transistor formed by the active area.

A voltage having the first level VDD may be applied to or an output pin of the cell area may be connected to the active area of the second dummy area DA2 in which the p-type transistor is formed. Alternatively, as shown in FIG. 5A, the active area of the second dummy area DA2 in which the p-type transistor is formed may be floated. A voltage having the second level VSS may be applied to the active area of the second dummy area DA2 in which the n-type transistor is formed.

The third dummy area DA3 may be located when, from among the region of the cell area adjacent to the dummy area, a voltage having the first level VDD is applied to the active area in which the p-type transistor is formed and an output signal is output from the active area in which the n-type transistor is formed. In this case, the voltage having the second level VSS may be applied to the gate line included in the gate line included in the third dummy area DA3. Thus, the output signal of the cell area may be prevented from being affected by the gate line included in the third dummy area DA3 and the transistor formed by the active area.

The voltage having the first level VDD may be applied to the active area of the third dummy area DA3 in which the p-type transistor is formed. The voltage having the second level VSS may be applied to or the output pin of the cell area may be connected to the active area of the third dummy area DA3 in which the n-type transistor is formed. Alternatively, as shown in FIG. 5A, the active area of the third dummy area DA3 in which the n-type transistor is formed may be floated.

Figure 6A:
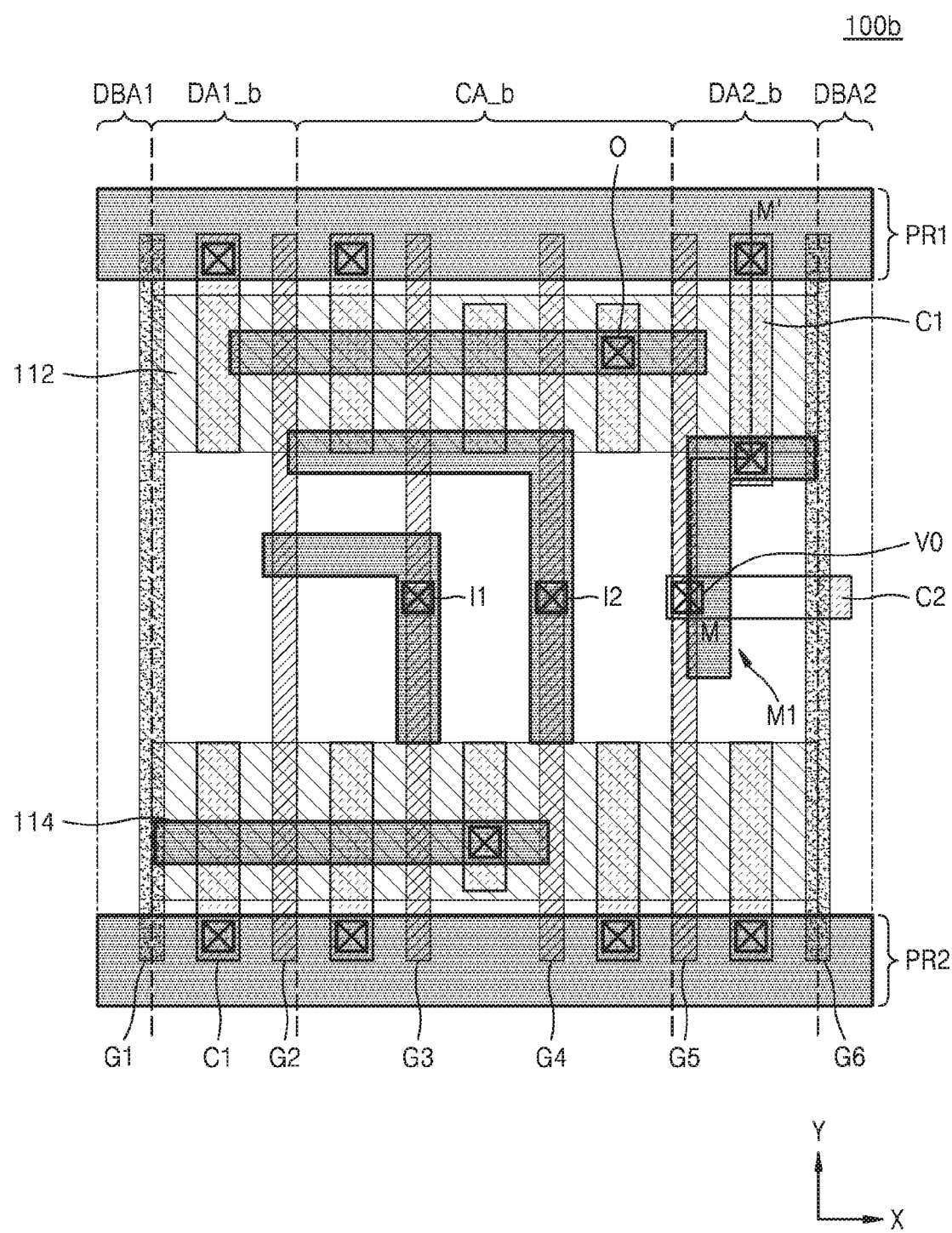
FIG. 6A illustrates a layout of a standard cell included in an IC according to an example embodiment.
Figure 6B:
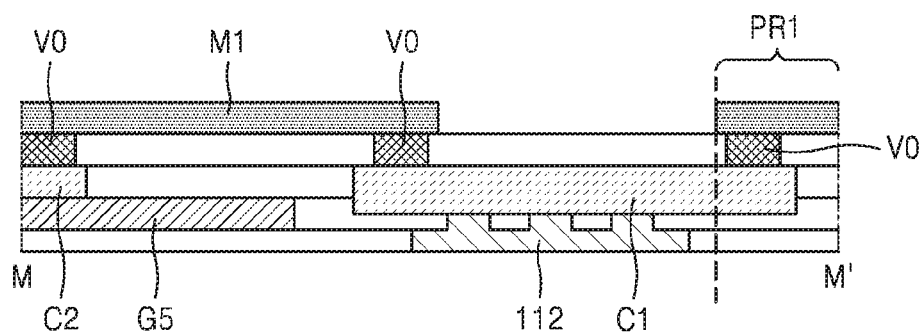
FIG. 6B is a cross-sectional view taken along a line M-M' of FIG. 6A.

FIG. 6A illustrates a layout of a standard cell 100b included in an IC according to an example embodiment. FIG. 6B is a cross-sectional view taken along a line M-M' of FIG. 6A. In FIG. 6A, the same reference numerals are used to denote the same elements as in FIG. 1A, and detailed descriptions of the same elements as in FIG. 1A will be omitted for brevity.

Referring to FIG. 6A, the standard cell 100b may include a cell area CA_b, a first boundary area DBA1 and a second boundary area DBA2 formed at interface surfaces of the standard cell 100b, and a first dummy area DA1_b and a second dummy area DA2_b, which are respectively adjacent to two sides of the cell area CA_b. Also, the standard cell 100b may include a first active area 112 and a second active area 114.

The first dummy area DA1_b may be located between the first boundary area DBA1 and the cell area CA_b, and the second dummy area DA2_b may be located between the second boundary area DBA2 and the cell area CA_b. Due to the arrangement of the first dummy area DA1_b and the second dummy area DA2_b, a distance from each of the first boundary area DBA1 and the second boundary area DBA 2 to the cell area CA_b may increase. Accordingly, an LLE caused by the first boundary area DBA1 and the second boundary area DBA2 to the cell area CA_b may be changed, and performance of the standard cell 100b may be improved. Also, by forming the first dummy area DA1_b and the second dummy area DA2_b in the standard cell 100b, a space may be ensured to facilitate an operation of generating interconnections between transistors included in the cell area CA_b.

Referring to FIGS. 6A and 6B, the standard cell 100b may include a plurality of layers. A gate line G5 included in the second dummy area DA2_b may be electrically connected to a first power rail PR1 through a first contact C1 that is in contact with the first active area 112. When comparing with FIGS. 1A and 1B, since the gate line G5 included in the second dummy area DA2_b is electrically connected to the first active area 112, the gate line G5 may have the same electric potential as the first active area 112. In contrast, in FIGS. 1A and 1B, since the gate line G5 and the first active area 112 are electrically isolated from each other, the gate line G5 may or may not have the same electric potential as the first active area 112.

Although FIG. 6B illustrates a case in which the first power rail PR1 includes only a metal line formed in the same layer as a metal line M1, the present disclosure is not limited thereto. The first power rail PR1 may include a metal line formed in a different layer from the metal line M1 or a plurality of metal lines formed in different layers.

Figure 7:
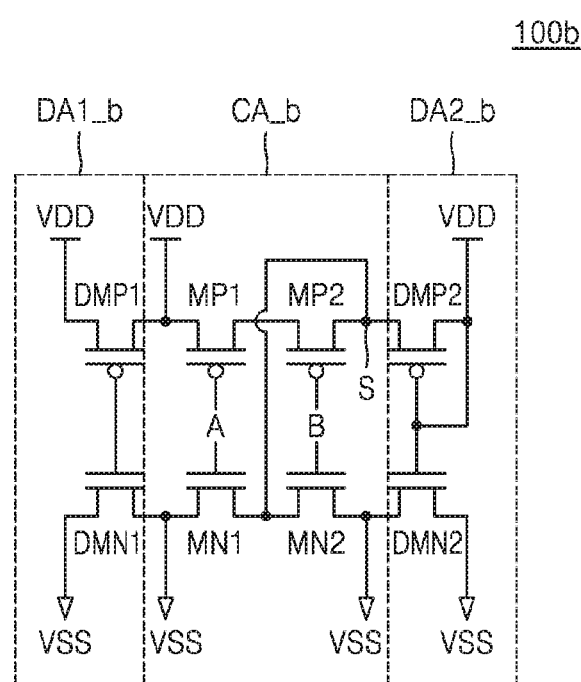
FIG. 7 is a circuit diagram of a standard cell included in an IC according to an example embodiment.

FIG. 7 is a circuit diagram of a standard cell included in an IC according to an example embodiment. FIG. 7 is a circuit diagram corresponding to the standard cell 100b shown in FIG. 6A. In FIG. 7, the same reference numerals are used to denote the same elements as in FIG. 2, and detailed descriptions of the same elements as in FIG. 2 will be omitted for brevity.

Referring to FIGS. 6A and 7, a first dummy area DA1_b and a second dummy area DA2_b may be located adjacent to a cell area CA_b, and a voltage applied to the first dummy area DA1_b and the second dummy area DA2_b may vary according to a voltage applied to a plurality of transistors, for example, transistors MP1, MP2, MN1, and MN2, which are included in the cell area CA_b. A plurality of dummy transistors, for example, dummy transistors DMP1, DMP2, DMN1, and DMN2, may be formed in the first dummy area DA1_b and the second dummy area DA2_b.

In an example embodiment, a first active area 112 formed in the first dummy area DA1_b may be electrically connected to a first power rail PR1 so that a voltage having a first level VDD may be applied to the first active area 112. A second active area 114 formed in the first dummy area DA1_b may be electrically connected to a second power rail PR2 so that a voltage having a second level VSS may be applied to the second active area 114. Since the same voltage is applied to a source region and a drain region of each of the dummy transistors DMP1 and DMN1, a gate line G2 included in the first dummy area DA1_b may be electrically floated. However, the present disclosure is not limited thereto, and the voltage having the first level VDD or the second level VSS may be applied to the gate line G2 included in the first dummy area DA1_b. A voltage applied to the first dummy area DA1_b will be described below later with reference to FIGS. 9A and 9B.

In an example embodiment, a gate line G5 included in the second dummy area DA2_b may be electrically connected to the first power rail PR1 so that a voltage having the first level VDD may be applied to the gate line G5. In this case, since the gate line G5 is electrically connected to the first active area 112 formed in the second dummy area DA2_b, a voltage having the first level VDD may also be applied to the first active area 112. The second active area 114 formed in the second dummy area DA2_b may be electrically connected to the second power rail PR2 so that a voltage having the second level VSS may be applied to the second active area 114.

Figure 8:
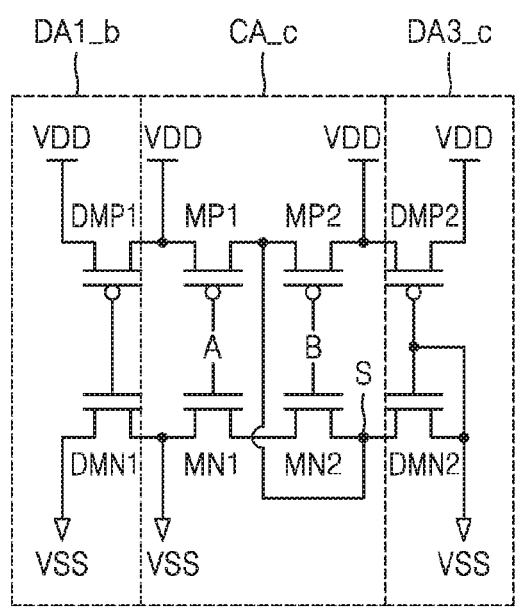
FIG. 8 is a circuit diagram of a standard cell included in an IC according to an example embodiment.

FIG. 8 is a circuit diagram of a standard cell included in an IC according to an example embodiment. In FIG. 8, the same reference numerals are used to denote the same elements as in FIG. 7. A detailed description of the same elements as in FIG. 7 will be omitted for brevity.

Referring to FIG. 8, a standard cell 100c may include a cell area CA_c, a first dummy area DA1_b, and a third dummy area DA3_c. The cell area CA_c may include a plurality of transistors, for example, p-type transistors MP1 and MP2 and n-type transistors MN1 and MN2, which have gates to which a first input signal A and a second input signal B are applied. The n-type transistors MN1 and MN2 may be connected in series, and the transistors MP1, MP2, MN1, and MN2 included in the cell area CA_c may constitute a NAND logic gate. The transistors MP1, MP2, MN1, and MN2 may output an output signal S based on the first input signal A and the second input signal B.

In an example embodiment, a plurality of dummy transistors, for example, dummy transistors DMP2 and DMN2, may be formed in a third dummy area DA3_c. Gates of the dummy transistors DMP2 and DMN2 may be electrically connected to a second active area (e.g., a region in which the transistor DMN2 is formed) formed in the third dummy area DA3_c so that the gates of the dummy transistors DMP2 and DMN2 may have the same electric potential as the second active area. The gates of the dummy transistors DMP2 and DMN2 may be electrically connected to a second power rail PR2 through a contact that is in contact with the second active area, so that a voltage having the second level VSS may be applied to the gates of the dummy transistors DMP2 and DMN2.

A first active area (e.g., a region in which the transistor DMP2 is formed) formed in the third dummy area DA3_c may be electrically connected to a first power rail PR1 so that a voltage having a first level VDD may be applied to the first active area.

Figures 9A, 9B:
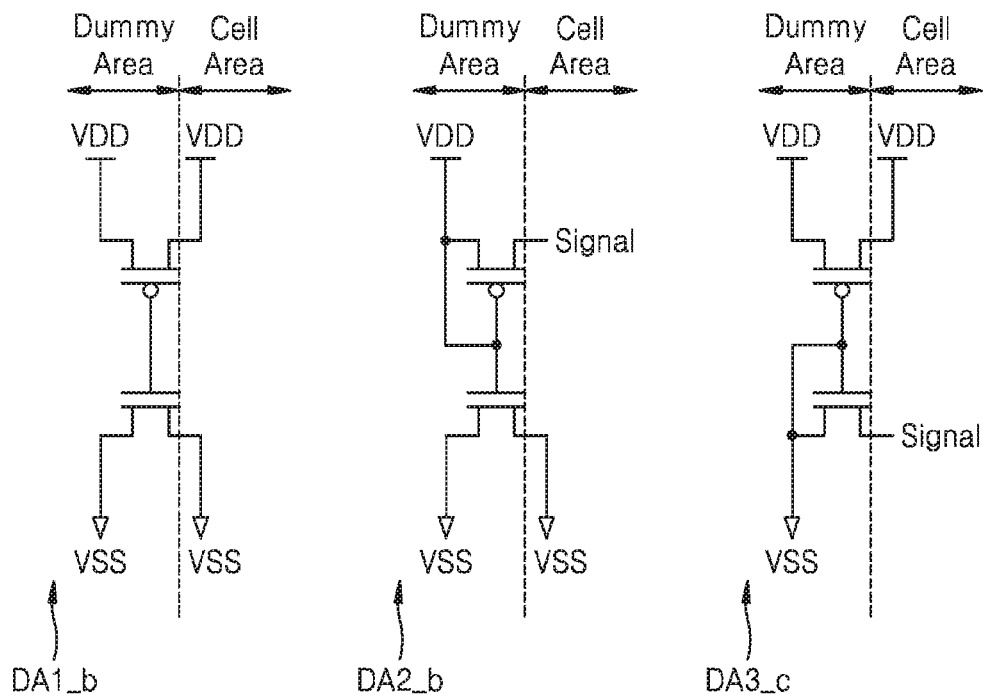
FIG. 9A is a circuit diagram of a dummy area of a standard cell included in an IC according to an example embodiment.
FIG. 9B is a table showing a voltage applied to a transistor formed in a dummy area.

FIG. 9A is a circuit diagram of a dummy area of a standard cell included in an IC according to an example embodiment. FIG. 9B is a table showing a voltage applied to a transistor formed in the dummy area.

Referring to FIGS. 9A and 9B, the IC according to the embodiment may include at least one of first to third dummy areas DA1_b, DA2_b, and DA3_c. In a cell area, one of first to third dummy areas DA1_b, DA2_b, and DA3_c may be located in the dummy area in response to a voltage applied to an active area adjacent to the dummy area.

Gate lines included in the first to third dummy areas DA1_b, DA2_b, and DA3_c may be electrically connected to the active area. For example, when a voltage is applied to the gate lines included in the first to third dummy areas DA1_b, DA2_b, and DA3_c, the gate lines may be electrically connected to a first power rail PR1 or a second power rail PR2 through a contact that is in contact with the active area.

The first dummy area DA1_b may be located when, from among a region of the cell area adjacent to the dummy area, a voltage having a first level VDD is applied to an active area (e.g., the first active area 112 of FIG. 6A) in which a p-type transistor is formed and a voltage having a second level VSS is applied to an active area (e.g., the second active area 114 of FIG. 6A) in which an n-type transistor is formed. In this case, the voltage having the first level VDD may be applied to the active area of the first dummy area DA1_b in which the p-type transistor is formed, and the voltage having the second level VSS may be applied to the active area of the first dummy area DA1_b in which the n-type transistor is formed. A voltage having the first level VDD or the second level VSS may be applied to the gate line included in the first dummy area DA1_b. Alternatively, as shown in FIG. 9A, the gate line included in the first dummy area DA1_b may be floated. Even if a voltage is not applied to the gate line included in the first dummy area DA1_b, an output signal of the cell area may not be affected.

The second dummy area DA2_b may be located when, from among the region of the cell area adjacent to the dummy area, an output signal is output from the active area in which the p-type transistor is formed and the voltage having the second level VSS is applied to the active area in which the n-type transistor is formed. In this case, the voltage having the first level VDD may be applied to the gate line included in the second dummy area DA2_b. Thus, the output signal of the cell area may be prevented from being affected by the gate line included in the second dummy area DA2_b and the transistor formed by the active area.

The voltage having the first level VDD may be applied to the active area of the second dummy area DA2_b in which the p-type transistor is formed, while the voltage having the second level VSS may be applied to the active area of the second dummy area DA2_b in which the n-type transistor is formed.

The third dummy area DA3_c may be located when, from among the region of the cell area adjacent to the dummy area, a voltage having the first level VDD is applied to the active area in which the p-type transistor is formed and an output signal is output from the active area in which the n-type transistor is formed. In this case, a voltage having the second level VSS may be applied to the gate line included in the third dummy area DA3_c. Thus, the output signal of the cell area may be prevented from being affected by the gate line included in the third dummy area DA3_c and the transistor formed by the active area. The voltage having the first level VDD may be applied to the active area of the third dummy area DA3_c in which the p-type transistor is formed, while the voltage having the second level VSS may be applied to the active area of the third dummy area DA3_c in which the n-type transistor is formed.

Figure 10:
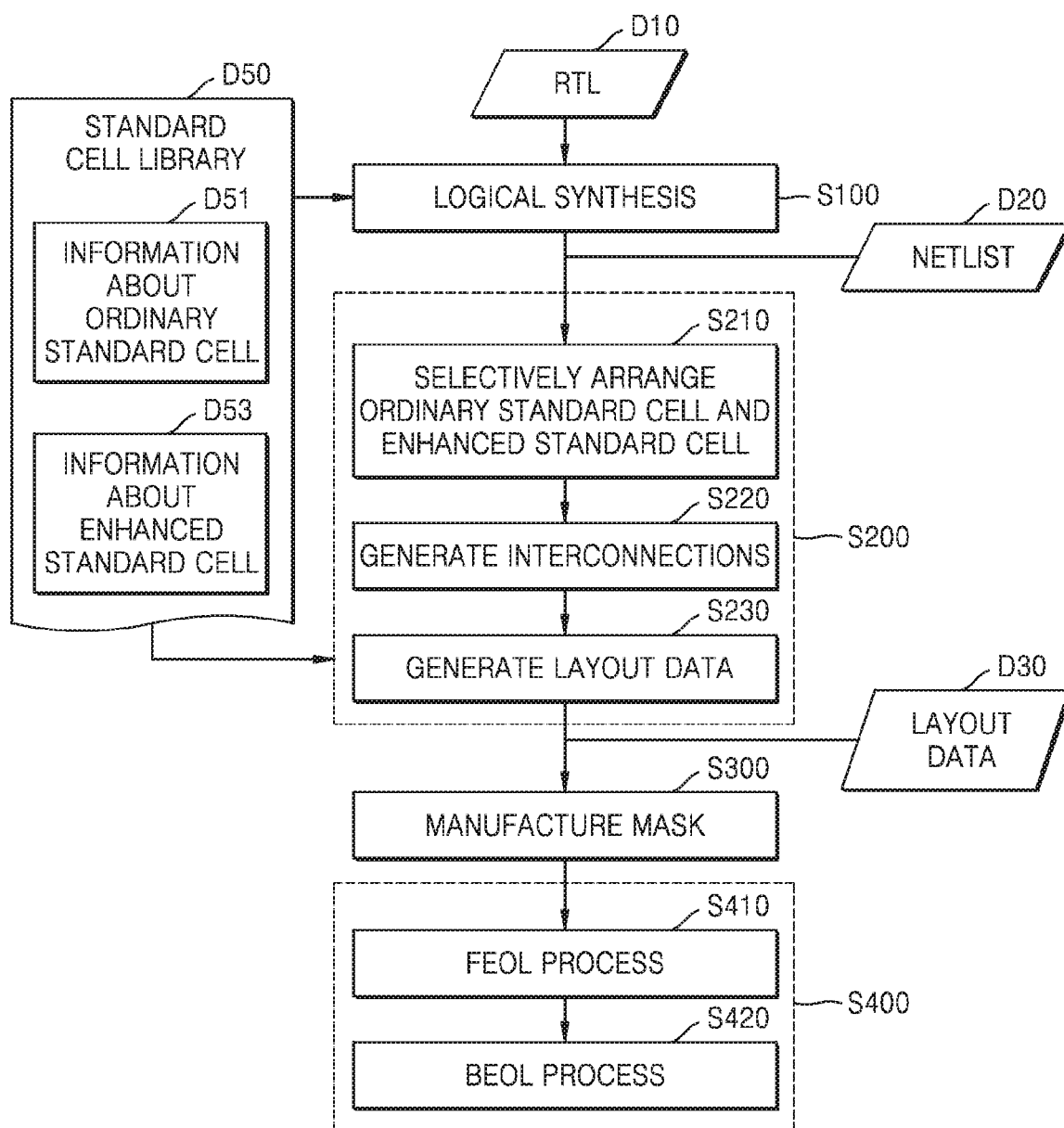
FIG. 10 is a flowchart of a method of fabricating an IC including a plurality of standard cells according to an example embodiment.

FIG. 10 is a flowchart of a method of fabricating an IC including a plurality of standard cells according to an example embodiment.

A standard cell library D50 may include information about the plurality of standard cells, for example, function information, characteristic information, and layout information. As shown in FIG. 10, the standard cell library D50 may include information D51 about the ordinary standard cell and information D53 about the enhanced standard cell. The enhanced standard cell may include at least one of the standard cells 100, 100a, 100b, and 100c having the dummy areas, which are shown in FIGS. 1A, 2, 4, 6A, 7, and 8. When the enhanced standard cell includes a dummy area as described above, a distance from a boundary area to a cell area may increase so that an LLE caused by the boundary area may be reduced.

In operation S100, a logical synthesis operation of generating netlist data D20 based on register-transfer level (RTL) data D10 may be generated. For example, a semiconductor design tool (e.g., a logical synthesis tool) may perform a logical synthesis operation with reference to the standard cell library D50 from RTL data D10, which is described as a hardware description language (HDL), such as a very-high-speed integrated circuits (VHSIC) hardware description language (VHDL) and Verilog, and generate netlist data D20 including a bitstream or a netlist.

In operation S200, a place & route (P&R) operation of generating layout data D30 from the netlist data D20 may be performed. The P&R operation S200 may include a plurality of operations, for example, operations S210, S220, and S230.

In operation S210, an operation of selectively arranging an ordinary standard cell and an enhanced standard cell may be performed. When a standard cell with improved performance is required, the enhanced standard cell may be arranged. For example, the enhanced standard cell may be located in a timing critical path. A semiconductor design tool (e.g., a P&R tool) may arrange a plurality of standard cells including the enhanced standard cell D50 with reference to the standard cell library D50 based on the netlist data D20.

In operation S220, an operation of generating interconnections may be performed. The interconnections may be electrically connected to output pins and input pins of the standard cells and include at least one via and at least one conductive pattern. The standard cells may be routed by generating the interconnections.

In operation S230, an operation of generating the layout data D30 may be performed. The layout data D30 may have a format (e.g., GDSII), and include geometric information about the standard cells and the interconnections.

In operation S300, an operation of manufacturing a mask may be performed. For example, patterns formed in a plurality of layers may be defined based on the layout data D30, and at least one mask (or a photomask) may be manufactured to form patterns of each of a plurality of layers.

In operation S400, an operation of fabricating an IC may be performed. For example, a plurality of layers may be patterned by using at least one mask manufactured in operation S300 to fabricate an IC. Operation S400 may include operations S410 and S420.

In operation S410, a front-end-of-line (FEOL) process may be performed. The FEOL process may refer to a process of forming individual devices, for example, a transistor, a capacitor, and a resistor, on a substrate during an IC fabricating process. For example, the FEOL process may include an operation of planarizing and cleaning a wafer, an operation of forming a trench, an operation of forming a well, an operation of forming a gate line, and an operation of forming a source and a drain.

In operation S420, a back-end-of-line (BEOL) process may be performed. The BEOL process may refer to a process of interconnecting individual devices, for example, a transistor, a capacitor, and a resistor, during an IC fabrication process. For example, the BEOL process may include an operation of siliciding a gate and source and drain regions, an operation of adding a dielectric material, a planarization operation, an operation of forming a hole, an operation of adding a metal layer, an operation of forming a via, and an operation of forming a passivation layer. Next, the IC may be packaged in a semiconductor package and used as a component for various applications.

Due to the BEOL process S420, a conductive pattern according to an embodiment may be formed, and a via may be formed to be electrically connected to the conductive pattern. For example, the layout data D30 may include geometric information about an output pin of a standard cell, which is defined by the standard cell library D50, and the output pin may be formed via the BEOL process using a mask manufactured based on the layout data D30. Also, the layout data D30 may include geometric information about a via located in a restricted region of the output pin of the standard cell, based on the information D51 about the ordinary standard cell and information D521 about the enhanced standard cell, which is included in the standard cell library D50, and the via may be formed via the BEOL process using the mask manufactured based on the layout data D30.

Figure 11:
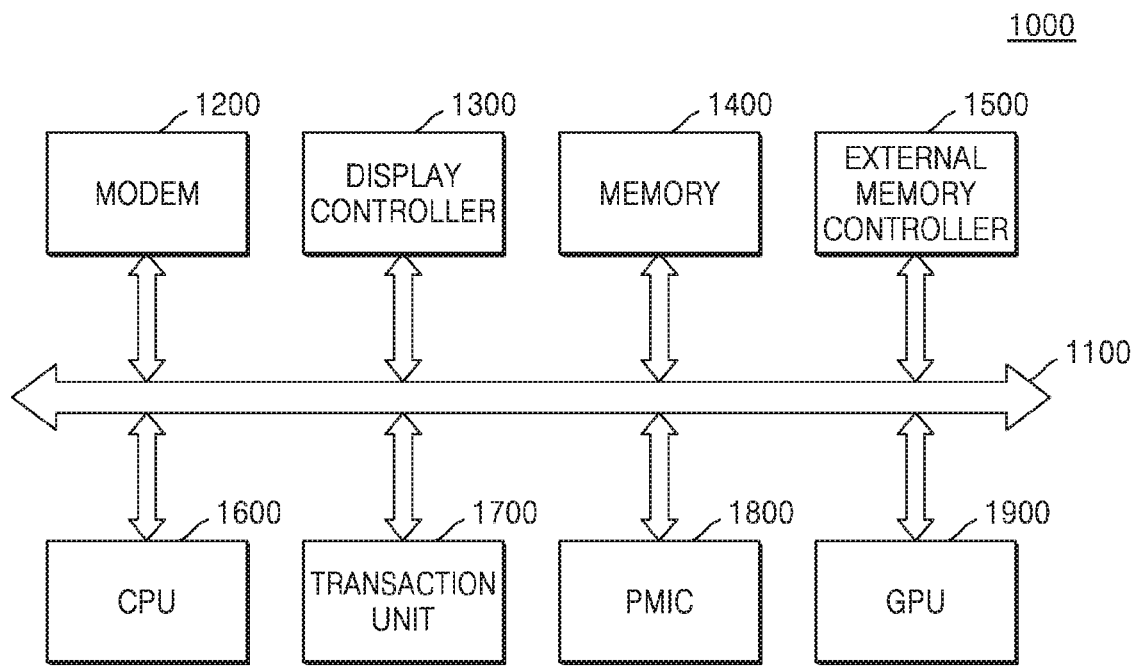
FIG. 11 is a block diagram of a System-on-Chip (SoC) according to an example embodiment.

FIG. 11 is a block diagram of a System-on-Chip (SoC) 1000 according to an example embodiment. The SoC 1000, which is a semiconductor device, may include an IC. Accordingly, the SoC 1000 may include at least one of the standard cells 100, 100a, 100b, and 100c including the dummy areas, which are shown in FIGS. 1A, 2, 4, 6A, 7, and 8.

The SoC 1000 may be embodied by integrating complicated function blocks (e.g., an intellectual property (IP) block) configured to serve various functions in a single chip. The standard cells according to the example embodiment may be included in the respective function blocks of the SoC 1000. Thus, electromigration may be prevented and/or alleviated, and the SoC 1000 with a reduced area and high functional reliability may be obtained.

Referring to FIG. 11, the SoC 1000 may include a modem 1200, a display controller 1300, a memory 1400, an external memory controller 1500, a central processing unit (CPU) 1600, a transaction unit 1700, a power management IC (PMIC) 1800, and a graphics processing unit (GPU) 1900. Respective function blocks of the SoC 1000 may communicate with one another via a system bus 1100.

The CPU 1600 capable of generally controlling an operation of the SoC 1000 may control operations of other function blocks including, for example, the modem 1200, the display controller 1300, the memory 1400, the external memory controller 1500, the CPU 1600, the transaction unit 1700, the PMIC 1800, and the GPU 1900. The modem 1200 may demodulate a signal received from the outside of the SoC 1000 or modulate a signal generated from the inside of the SoC 1000 and externally transmit the demodulated signal or the modulated signal. The external memory controller 1500 may control an operation of transmitting and receiving data to and from an external memory device connected to the SoC 1000. For example, a program and/or data stored in the external memory device may be provided to the CPU 1600 or the GPU 1900 under the control of the external memory controller 1500. The GPU 1900 may execute program instructions related to graphic processing. The GPU 1900 may receive graphic data through the external memory controller 1500 or transmit graphic data processed by the GPU 1900 through the external memory controller 1500 to the outside of the SoC 1000. The transaction unit 1700 may monitor data transaction of each of the function blocks, and the PMIC 1800 may control power supplied to each of the function blocks under the control of the transaction unit 1700. The display controller 1300 may control a display (or a display device) located outside the SoC 1000 and transmit data, which is generated in the SoC 1000, to the display.

The memory 1400 may include a non-volatile memory, such as electrically erasable programmable read-only memory (EEPROM), flash memory, phase-change random access memory (PRAM), resistive RAM (RRAM), nano-floating gate memory (NFGM), polymer RAM (PoRAM), magnetic RAM (MRAM), and ferroelectric RAM (FRAM). Alternatively, the memory 1400 may include a volatile memory, such as dynamic RAM (DRAM), static RAM (SRAM), mobile DRAM, double-data-rate synchronous DRAM (DDR SDRAM), low-power DDR (LPDDR) SDRAM, graphic DDR (GDDR) SDRAM, and Rambus DRAM (RDRAM).

Figure 12:
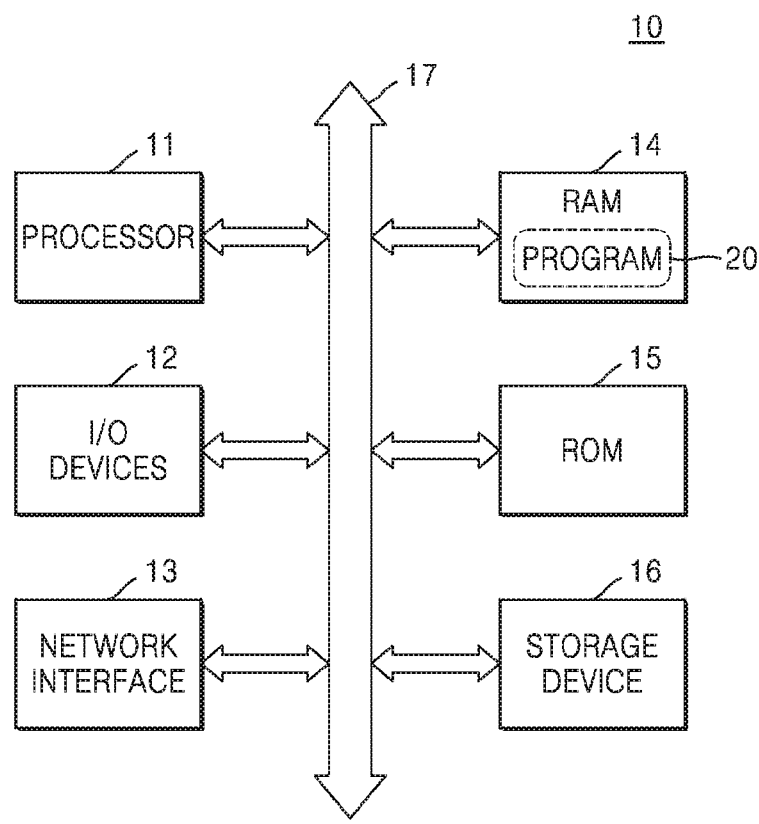
FIG. 12 is a block diagram of a computing system including a memory configured to store a program, according to an example embodiment.

FIG. 12 is a block diagram of a computing system 10 including a memory configured to store a program, according to an example embodiment. At least some of operations included in a method (e.g., the method shown in FIG. 10) of fabricating an IC according to an example embodiment may be performed in the computing system 10.

The computing system 10 may be a fixed computing system (e.g., a desktop computer, a workstation, and a server) or a portable computing system (e.g., a laptop computer). As shown in FIG. 12, the computing system 10 may include a processor 11, input/output (I/O) devices 12, a network interface 13, RAM 14, ROM 15, and a storage device 16. The processor 11, the I/O devices 12, the network interface 13, the RAM 14, the ROM 15, and the storage device 16 may be connected to a bus 17 and communicate with one another via the bus 17.

The processor 11 may be referred to as a processing unit and include, for example, at least one core (e.g., a microprocessor (MP), an application processor (AP), a digital signal processor (DSP), and a graphics processing unit (GPU)), which may execute an arbitrary command set (e.g., Intel Architecture-32 (IA-32), 64-bit expansion IA-32, x86-64, PowerPC, Sparc, microprocessor without interlocked pipeline stages (MIPS), advanced RISC machines (ARM), and IA-64). For example, the processor 11 may access a memory (i.e., the RAM 14 or the ROM 15) via the bus 17 and execute commands stored in the RAM 14 or the ROM 15. As shown in FIG. 1, the RAM 14 may store a program 2000 according to an embodiment or at least a portion thereof, and the program 2000 may enable the processor 11 to perform at least some of operations included in a method of fabricating an IC. That is, the program 2000 may include a plurality of commands that may be executed by the processor 11, and the plurality of commands included in the program 2000 may enable the processor 11 to perform, for example, a logical synthesis operation (refer to S100 in FIG. 10) and/or a place and route (P&R) operation (refer to S200 in FIG. 10).

The storage device 16 may not lose stored data even if power supplied to the computing system 10 is interrupted. For example, the storage device 16 may include a non-volatile memory device or a storage medium, such as a magnetic tape, an optical disc, and a magnetic disc. Also, the storage device 16 may be attachable to and detachable from the computing system 10. The storage device 16 may store the program 2000 according to the example embodiment. Before the program 2000 is executed by the processor 11, the program 2000 or at least part of the program 2000 may be loaded from the storage device 16 into the RAM 14. In another case, the storage device 16 may store a file described in a program language, and the program 2000, which is generated by a compiler based on the file, or at least part of the program 2000 may be loaded into the RAM 14. Also, as shown in FIG. 12, the storage device 16 may store a database 251, and the database 251 may include information (e.g., the standard cell library D50 of FIG. 10) required to design an IC.

The storage device 16 may store data to be processed by the processor 11 or data processed by the processor 11. That is, based on the program 2000, the processor 11 may generate data by processing data stored in the storage device 16 and store the generated data in the storage device 16. For instance, the storage device 16 may store RTL data D10, netlist data D200, and/or layout data D30.

The I/O devices 12 may include an input device, such as a keyboard and a pointing device, and an output device, such as a display device and a printer. For example, by using the I/O devices 12, a user may trigger execution of the program 2000 due to the processor 11, input the RTL data D10 and/or the netlist data D200 of FIG. 10, or confirm the layout data D30 of FIG. 10.

The network interface 13 may provide access to a network outside the computing system 10. For example, the network may include a plurality of computing systems and a plurality of communication links. The communication links may include wired links, optical links, wireless links, or links of arbitrary different types.

While the present disclosure has been particularly shown and described with reference to embodiments thereof, it will be understood that various changes in form and details may be made therein without departing from the spirit and scope of the following claims.

What is claimed is:

1. An integrated circuit comprising:
    a plurality of standard cells, wherein at least one standard cell of the plurality of standard cells comprises:
       a cell area comprising at least one transistor configured to determine a function of the at least one standard cell;
       a first dummy area and a second dummy area respectively adjacent to two comprising sides of the cell area in a first direction;
       an active area extending in the first direction across the cell area, the first dummy area, and the second dummy area; and
       a first boundary area and a second boundary area that are adjacent to the first dummy area and the second dummy area, respectively, and disposed farther away from the cell area than the first dummy area and the second dummy area, respectively,
    wherein the active area comprises a first active area and a second active area, which are spaced apart from each other in a second direction perpendicular to the first direction and extend parallel to each other in the first direction,
    wherein at least one from among the first active area and the second active area provided in the first dummy area is biased, and
    wherein at least one from among the first active area and the second active area provided in the second dummy area is biased.

2. The integrated circuit of claim 1, wherein a first voltage having a first level is applied to the first active area provided in the first dummy area, and a second voltage having a second level lower than the first level is applied to the second active area provided in the first dummy area.

3. The integrated circuit of claim 2, wherein the first dummy area comprises a gate line to which at least one from among the first voltage having the first level and the second voltage having the second level is applied.

4. The integrated circuit of claim 1, wherein the second dummy area comprises a gate line to which at least one from among a first voltage having a first level and a second voltage having a second level lower than the first level is applied.

5. The integrated circuit of claim 4, wherein the first active area provided in the second dummy area is electrically connected to an output pin of the at least one standard cell, and the second voltage having the second level is applied to the second active area provided in the second dummy area.

6. The integrated circuit of claim 4, wherein the first voltage having the first level is applied to the first active area provided in the second dummy area, and the second active area provided in the second dummy area is electrically connected to an output pin of the at least one standard cell.

7. The integrated circuit of claim 4, wherein at least one from among the first active area and the second active area provided in the second dummy area has a same electric potential as the gate line of the second dummy area.

8. The integrated circuit of claim 1, wherein
    the active area is separated from the first boundary area and the second boundary area.

9. The integrated circuit of claim 1, wherein a first voltage applied to the first active area and the second active area provided in the first dummy area and the second dummy area, respectively, varies according to a second voltage applied to regions of the first active area and the second active area of the cell area, the regions being adjacent to the first dummy area and the second dummy area, respectively.

10. The integrated circuit of claim 1, wherein one area from among the first boundary area and the second boundary area comprises a double diffusion break, and another area from among the first boundary area and the second boundary area comprises a single diffusion break.

11. An integrated circuit comprising:
    a plurality of standard cells, wherein at least one standard cell of the plurality of standard cells comprises:
       a first power rail and a second power rail, each of the first power rail and the second power rail extending in a first direction to supply power to the at least one standard cell, the first power rail and the second power rail being spaced apart from each other in a second direction perpendicular to the first direction;
       a cell area including at least one transistor configured to determine a function of the at least one standard cell;
       a dummy area adjacent to two opposing sides of the cell area in the first direction;
       an active area extending in the first direction across the cell area and the dummy area; and
       a boundary area adjacent to the dummy area and disposed farther away from the cell area than the dummy area,
    wherein the active area comprises a first active area and a second active area, which are spaced apart from each other in the second direction and extend parallel to each other in the first direction, and
    wherein the first active area provided in the dummy area is electrically connected to the first power rail, and the second active area provided in the dummy area is electrically connected to the second power rail.

12. The integrated circuit of claim 11, wherein the dummy area comprises a gate line electrically connected to one from among the first power rail and the second power rail.

13. The integrated circuit of claim 11, wherein the active area is separated from the boundary area.

14. The integrated circuit of claim 11, wherein the boundary area comprises one from among a double diffusion break and a single diffusion break.

* * * * *